United States Patent [19]

Dreher et al.

[11] Patent Number: 5,309,325
[45] Date of Patent: May 3, 1994

[54] LOCKING CIRCUIT BOARD INJECTOR/EXTRACTOR

[75] Inventors: John P. Dreher, Mira Loma; Raymond G. Bond, Long Beach, both of Calif.

[73] Assignee: EG&G Birtcher, Inc., El Monte, Calif.

[21] Appl. No.: 19,775

[22] Filed: Feb. 19, 1993

[51] Int. Cl.⁵ .............................................. H05K 7/16
[52] U.S. Cl. ..................... 361/754; 361/798; 403/321; 439/157; 439/160
[58] Field of Search .............. 361/724-727, 361/754, 798; 292/241; 211/41; 403/16, 321; 439/152-160

[56] References Cited

U.S. PATENT DOCUMENTS

| | | | |
|---|---|---|---|
| 3,467,891 | 9/1969 | Mogle | 361/725 |
| 3,577,113 | 5/1971 | Maitland | 439/155 |
| 4,083,616 | 4/1978 | McNiece et al. | 439/157 |
| 4,586,766 | 5/1986 | Hofmeister | 439/160 |
| 4,780,792 | 10/1988 | Harris et al. | 361/786 |

FOREIGN PATENT DOCUMENTS 0627607  9/1978  U.S.S.R. ........................... 439/153

OTHER PUBLICATIONS

Series 87 Nylon Extractor-Lock (Shown in EG&G Birtcher Catalog 1992, p. 39).
Series 107-70 Card Inserter-Extractor (Shown in Calmark Catalog p. 40).

Primary Examiner—Leo P. Picard
Assistant Examiner—Donald A. Sparks
Attorney, Agent, or Firm—Wolf, Greenfield & Sacks

[57] ABSTRACT

An injector/extractor for circuit boards is disclosed. The device includes a slideably engagable locking member adapted to engage a locking pin mounted on a circuit board to prevent accidental release of a circuit board from a chassis.

21 Claims, 4 Drawing Sheets

LOCKING CIRCUIT BOARD INJECTOR/EXTRACTOR

FIELD OF THE INVENTION

This invention pertains to electronic packaging, and more particularly to circuit board injector/extractors.

BACKGROUND OF THE INVENTION

A wide range of electronic hardware requires the use of multiple circuit boards having electronic devices mounted thereon. In order to minimize space, such devices typically comprise a plurality of boards mounted in a side by side relationship within a chassis. The boards are designed to be individually removable from the chassis to allow them to be tested, repaired or replaced with updated circuitry if desired.

Because of the close spacing between individual circuit boards mounted in a chassis, it is often difficult to grip an individual circuit board with the requisite strength required to withdraw it from the chassis. In order to overcome this problem, circuit boards have been provided with various mechanisms designed to allow a technician to grip the circuit board with sufficient strength to remove it from its mounting. The earliest attempts to overcome this problem comprised simply of providing small handles mounted on the exposed edge of the circuit board. Although these handles are still used and remain useful in removing closely spaced circuit boards from a chassis, they did not address the additional problem of providing a secure mount for the circuit board within the chassis.

In numerous high performance applications such as avionics and military hardware, the chassis mounting the circuit boards is subjected to a high degree of motion and vibration. These forces may cause a circuit board to be shaken free of its mounting position, and ultimately free of electrical contact with the chassis and the remaining circuitry. Such a result may have catastrophic consequences causing either the loss of necessary function of the electronic device, or the failure of the device in its entirety.

To address the issue of undesired release, circuit boards have been provided with injector/extractor mechanisms. These mechanisms typically comprise a lever mounted on the edge of a circuit board near its upper or lower corner. The lever is mounted to the circuit board using a pivot pin which allows the lever to pivot from a first position, flush with an edge of the circuit board, to a second position which provides a handle for pulling and removing the circuit board from the chassis. Additionally, such injector/extractors often include a section positioned on the opposing side of the pivot pin which engages the chassis within which the circuit board is mounted and acts either as a fulcrum to either pull the circuit board from its mounted position or as an interference member to maintain the circuit board within its mount.

Although the injectors/extractors described above represent a significant improvement over the earlier circuit board handles, their performance is less than ideal as they are still subject to vibrational motion and the possibility of inadvertent release. Additionally, due to the lever nature of such devices, it is relatively easy for such devices to accidentally release by becoming snagged on a technician's clothing, tools, or work materials. As with vibratory release, if the condition remains undetected, failure of the electronic hardware will likely result.

In view of the above, a need exists for an injector/extractor that allows a circuit board to be easily locked into or released from a chassis and also which is not likely to release when subjected to vibration or snagging. It is also desirable that such a device be simple to manufacture and use. In addition, a need exists for an injector/extractor device having means for visually indicating that a circuit board is properly locked within its chassis.

SUMMARY OF THE INVENTION

The present invention relates to an improved injector/extractor. More specifically, the invention relates to an injector/extractor that may be releaseably locked into position to prevent accidental release of a circuit board from its chassis.

In one embodiment, the device of the present invention comprises an injector/extractor comprising a body portion having lever arm, a means for engaging a pivot pin, and a means for engaging the chassis of the electronic device within which the circuit board is mounted. The injector/extractor further includes a locking member, slideably mounted on the lever arm, having an engagement arm for releaseably engaging a locking pin mounted on the circuit board.

In an alternative embodiment, the device of the present invention comprises a one piece unit comprising a body having a lever arm, a means for engaging a pivot pin, and a means for engaging the chassis. The body portion further includes a locking member mounted on the lever arm which is adapted to engage a locking pin mounted on the circuit board. The means for engaging the pivot pin may comprise an elongated aperture which is adapted to allow the extractor to be slideably moved in a first direction causing the engagement arm to engage the locking pin, and in a second direction causing the engagement arm to release the locking pin.

In each of the embodiments described above, when the locking arm engages the locking pin, the injector/extractor is prevented from moving away from the edge of the circuit board and from releasing the circuit board from its mounting.

In each of the embodiments, the injector/extractor may be provided with a visual indicator to confirm that the device is properly locked or released.

Additional features and advantages of the invention will be set forth in the description which follows, making reference to the accompanying figures.

DETAILED DESCRIPTION OF THE INVENTION

Figure 1:
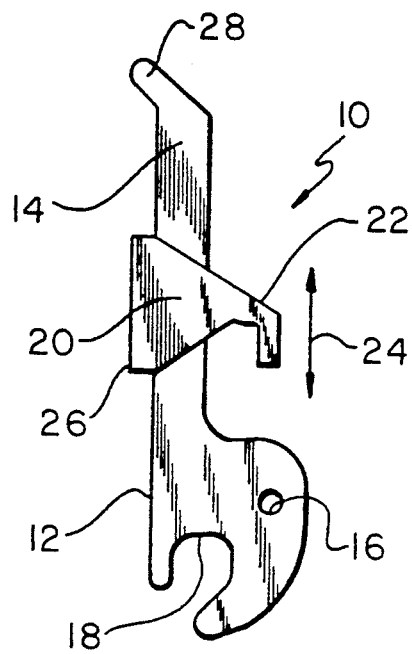
FIG. 1 is schematic elevation of a two piece injector/extractor of the present invention.

A two part embodiment of the device of the present invention is depicted schematically in FIG. 1. The device 10 comprises a body portion 12 having a lever arm 14, a pivot aperture 16 and a chassis engaging member 18. The device further includes a locking member 20 slideably mounted on the lever arm 14 and having an engaging arm 22 adapted to engage a locking pin mounted on a circuit board. The locking member 20 may be moved along the lever arm 14 in the directions indicated by arrow 24. When the locking member 20 is in its upper position the device is unlocked, and when it is moved into its lower position the engagement arm is caused to engage the locking pin. It is preferred that a control surface 26 on the locking member 20 be textured in order to aid a technician in sliding the locking member 20 between its locked and unlocked positions. Additionally, it is preferred that the lever arm 14 includes a handle 28 which aids in pivoting the body 12 about the pivot pin.

The lower portion of the body (encompassing the chassis engaging member and the pivot aperture) and the locking member preferably include a slot to thereby allow the device 10 to be positioned on both sides of the circuit board. This configuration is more clearly visible in the embodiment shown in FIG. 4; however it is intended to apply to the other embodiments as well. Alternatively, the device 10 could be mounted on a single side of the circuit board.

The body and locking member may be made from any of a wide variety of materials. In one embodiment, either one or both of the body and locking member are made of polymeric materials such as nylon, or ABS plastic. Alternatively, either one or both of these pieces may be fabricated of metal or a metallic alloy. Aluminum is preferred. The metal or metallic alloy may be anodized and/or provided with a hard coat to protect the metal and prevent corrosion.

In the two piece embodiment of FIG. 1, it is desirable that frictional forces between the locking member and the body be minimized to prevent binding between these pieces. Thus, the material used to fabricate these pieces should be such that the friction between them is relatively low. If, however, it is necessary to fabricate the device of materials having relatively high friction, either one or both of the pieces, in their area of sliding contact, may be provided with a low friction coating or material such as a polyfluorotetraethylene tape.

Figure 2A:
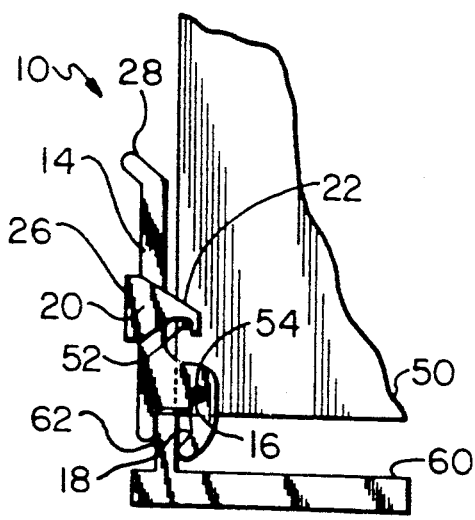
FIGS. 2A-2C are schematic representations of the injector/extractor of FIG. 1 mounted on a circuit board showing the assembly in its locked, unlocked, and retracted states.
Figure 2B:
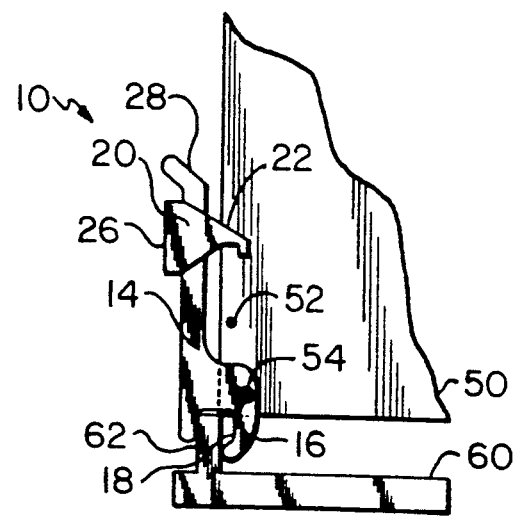
Figure 2C:
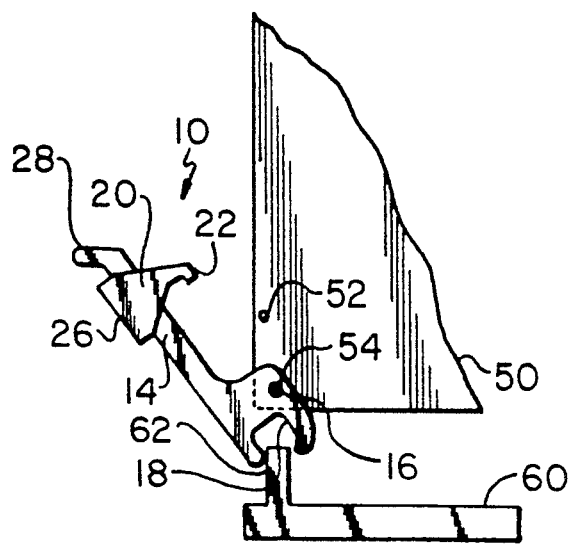

The operation of the device of FIG. 1 may be seen with reference to FIGS. 2A-2C. In FIG. 2A, the device 10 is shown in its locked position on a circuit board 50. The locking member 20 has been slid into its downward position to allow the locking arm 22 to engage a locking pin 52 mounted on the circuit board 50. The body 12 of the device 10 is pivotably mounted to the circuit board 50 via a pivot pin 54. Each of the locking 52 and pivot 54 pins may be mounted to the circuit board 50 through an aperture therein and may extend outwardly from either one or both sides of the circuit board. It is noted that the pivot pin and the locking pin are not intended to limit the invention to pins, per se. Rather, numerous other embodiments offering the functions of providing a pivot point and a locking point are contemplated as well.

Circuit board 50 is mounted within a chassis 60 having a flange 62 engaged by the chassis engaging member 18 on the body portion 12 of the injector/extractor. As will be discussed with reference to FIGS. 5A-5C, the flange may, in the alternative, comprise any structure which cooperates with the chasis engaging member. For example, a channel in which the chassis engaging member may be seated is contemplated as well. Since the locking member 20 has been slid downwardly to cause the engagement arm 22 to engage the locking pin 52, the lever arm 14 is prevented from pivoting backward about the pivot pin 54, and is thus prevented from releasing the circuit board 50 from the chassis 60. It is desirable that the engagement arm 22 engage the locking pin 62 with a relatively tight fit as a further obstacle to vibrational or inadvertent release.

In FIG. 2B the injector/extractor has been unlocked by sliding the locking member 22 upwardly, thereby causing the engagement arm 22 to release the locking pin 52. In this state, although the circuit board 50 is still locked and maintained in its service position in the chassis 60 the assembly is prepared for release of the circuit board 50 by a backward pivoting of the lever arm 14 about the pivot pin 54.

In FIG. 2C, release of the circuit board is shown. In this figure, the lever arm 14 has been pivoted backward about pivot pin 54. In so doing, one surface of the chassis engaging member 18 is forced against the flange 62 on the chassis 60 causing the flange 62 to act as a fulcrum. This motion causes the circuit board 50 to be drawn backward in the direction of the lever arm 14, thus unlocking and releasing the circuit board from the chassis. The lever arm 14 then serves as a convenient handle allowing the circuit board to be further retracted until a sufficient gripping surface of the circuit board is exposed. At this point, the circuit board may be gripped using any conventional method and withdrawn for testing, service or replacement.

Figure 3A:
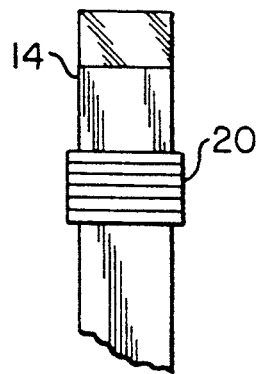
FIGS. 3A and 3B are schematic representations of the device of FIG. 1 having a visual indicator thereon.
Figure 3B:
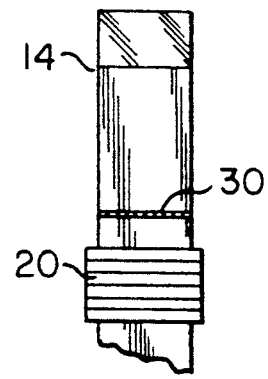

In one embodiment of the device above, (depicted in FIGS. 3A and 3B) the lever arm 14 is provided with a visual indicator 30 which serves to indicate whether the locking member 20 is in its locked or unlocked position. Specifically, the indicator 30 is positioned on lever arm 14 at a location obscured by the locking member 20 when the locking member is in its unlocked position. Upon sliding the locking member 20 downward into its locked position, the indicator is exposed. Alternatively, the indicator may be positioned on the lever arm 14 in a position which is obscured by the locking member 20 when the member is in its locked position. In that embodiment, the indicator will be visible when the injector/extractor is unlocked, and obscured when the injector/extractor is locked.

If the indicator is selected to be visible when the locking member is in its locked position, it is preferable to make the indicator of an affirmative color such as green. Alternatively, if the indicator is intended to be visible when the locking member is unlocked, it is preferable to make the indicator a negative or warning color such as red. In another embodiment, both affirmative (locked) and negative (unlocked) indicators may be provided on the lever arm. In still another embodiment, the locking member is provided with an aperture that allows the surface of the lever arm within the locking member to be visualized. One or more indicators indicating either one or both of the locked and unlocked states may be provided on the lever arm. The indicators are visualized through the aperture in the locking member.

Figure 4:
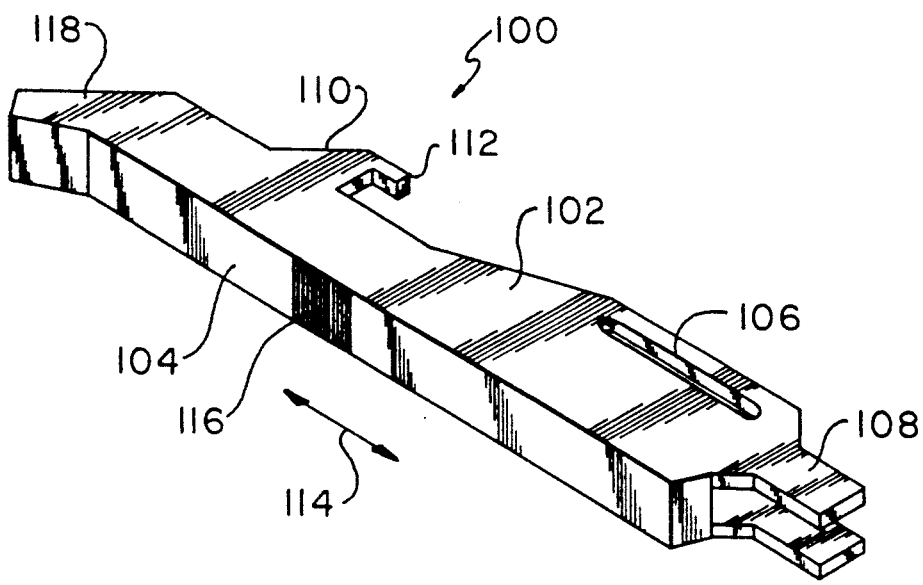
FIG. 4 is a perspective view of a one piece injector/extractor of the present invention.

A second embodiment of the present invention is depicted in FIG. 4. This embodiment comprises a one-piece injector/extractor. Specifically, the device 100 comprises a body 102 having a lever arm 104, pivot aperture 106, and a chassis engaging member 108. The device further includes a locking member 110 having a locking pin engaging arm 112 positioned thereon. The pivot aperture 106 comprises an elongated aperture which allows the entire device 100 to be slideably moved in the direction of arrow 114. The device further includes a textured control surface 116 and a handle 118 positioned at the end of the lever arm 104 to aid in pivoting the device about the pivot pin.

Figure 5A:
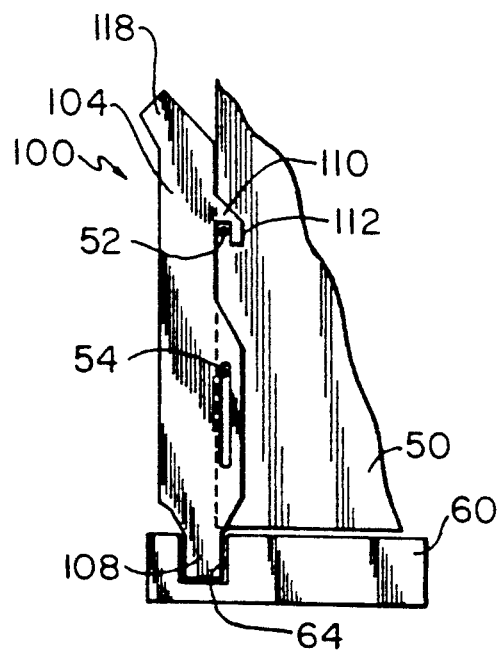
FIGS. 5A-5C are schematic representations of the injector/extractor of FIG. 4 mounted on a circuit board showing the assembly in its locked, unlocked, and released states.
Figure 5B:
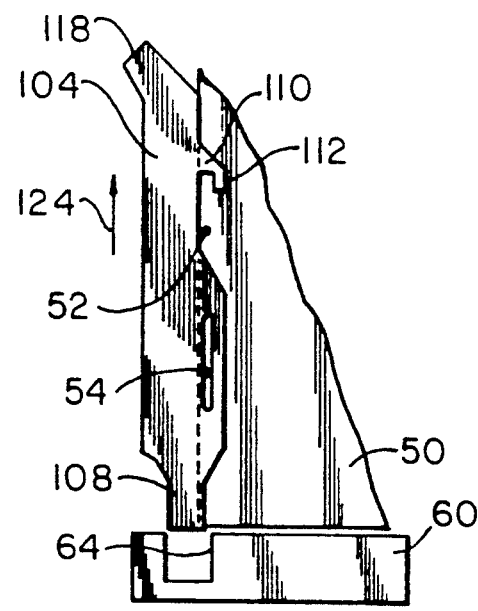
Figure 5C:
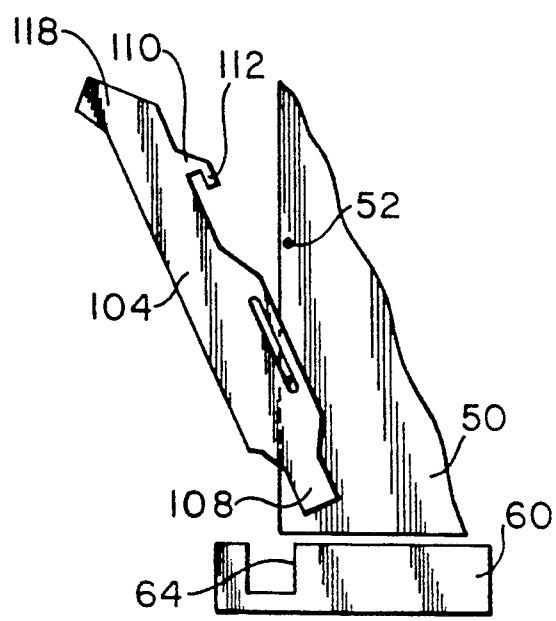

The operation of the device of FIG. 4 is shown in FIGS. 5A–5C. In FIG. 5A, the one piece device 100 is shown in its locked position. Specifically, the one-piece device 100 is mounted on a circuit board 50 by a pivot pin 54 passing through the pivot aperture 106. The device 100 is moved downward on pivot pin 54 causing the locking member 110 and its engagement arm 112 to engage a locking pin 52 mounted on the circuit board. A chassis-engagement member 108 engages a channel 64, formed on the chassis 60. As in the two piece embodiment, the pivot pin and locking pin are not intended to be limited to pins, per se. Likewise, the channel 64 may be replaced by a flange 62 as described previously.

If the device 100 is slid in the upper direction as indicated by arrow 124 and depicted in FIG. 5B, the engagement arm 112 on the locking member 110 is caused to release the locking pin 52. In this state, although the circuit board 50 is still mounted to the chassis 60, the injector/extractor is no longer locked in position or prevented from being pivoted to release the circuit board.

Release of the circuit board 50 is shown in FIG. 5C. In this figure, the lever arm 104 has been pivoted backward about the pivot pin 54 via the handle 118. In so doing, the chassis engagement member 108 presses against the wall of channel 64 on the chassis 60 and acts as a fulcrum to pull the circuit board upward and backward from the chassis. The lever arm 104 serves as a handle allowing the circuit board 50 to be drawn backward until the circuit board 50 may be sufficiently gripped to allow its removal from the chassis.

Figures 6A, 6B:
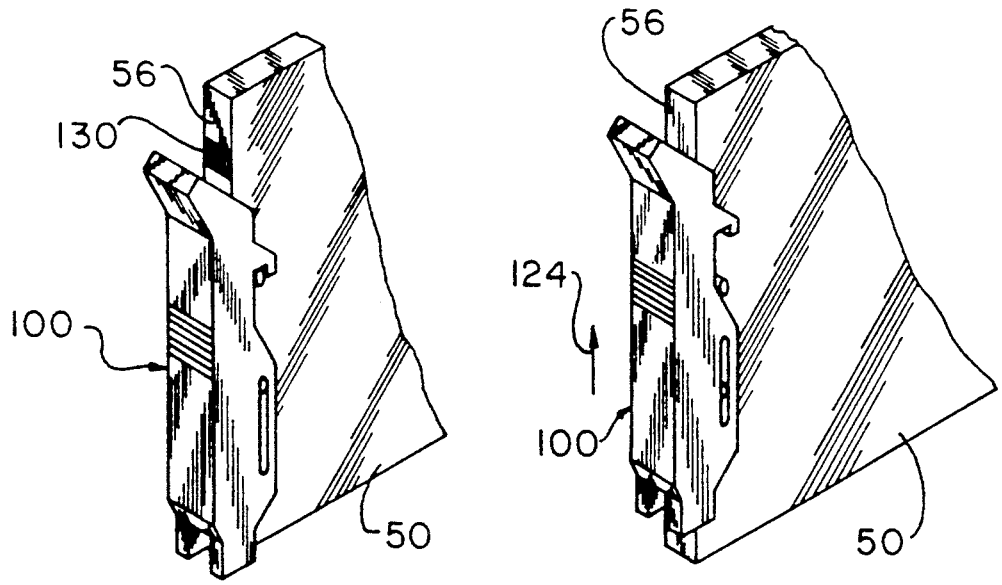
FIGS. 6A and 6B are schematic representations of the device of FIG. 4 and a related visual indicator.

As may be seen in FIGS. 6A and 6B, the edge 56 of the circuit board 50 may be provided with an indicator 130 which is obscured by the device 100 when the device is in its unlocked position. Specifically, FIG. 6A depicts the device in its downward, locked position. The indicator 130 on the edge 56 of the circuit board 50 is visible and serves as an indication that the board is locked into position. As shown in FIG. 6B, if the device 100 is slid upwardly in the direction of arrow 124, the indicator 130 is obscured, and thus, there is no indication that the circuit board is locked into place. The indicator may be any type of coloring or dye on the edge of the circuit board and may be provided thereon either during circuit board manufacture or at a later time. Alternatively, the indicator may comprise either one or a plurality of markings on the edge 56 of the circuit board 50 which can be viewed through an aperture formed in the lever arm. As before the markings are preferably of appropriate colors to indicate locked and unlocked states of the device.

Equivalents

Additional advantages and modifications will be readily apparent to those skilled in the art. The invention in its broader aspects is not limited to the specific details, representative apparatus, and illustrative examples shown and described. For example various other chassis engagement assemblies, visual indicators and the like are contemplated as well. Accordingly, departure may be made from such details without departing from the spirit or scope of the inventive concept. Rather, the scope of the invention is that embodied by the following claims:

What is claimed is:

1. A locking circuit board extractor for releaseably mounting a circuit board in a chassis comprising:
    a) a body portion adapted to be mounted on an edge of the circuit board, the body portion having a lever arm, a means for engaging a pivot, and a means for engaging the chassis;
    b) a locking member mounted on said body portion and having an engagement arm, wherein said engagement arm is adapted to allow a locking point mounted on the circuit board to be releasably engaged by sliding the engagement arm in a direction substantially parallel to the edge of the circuit board.

2. The locking circuit board extractor of claim 1 which further comprises at least one indicator positioned on the lever arm for indicating that the locking member has engaged the locking point.

3. The locking circuit board extractor of claim 1 which further comprises at least one indicator positioned on the lever arm for indicating that the locking member has released the locking point.

4. The locking circuit board extractor of claim 1 which further comprises means for visualizing at least one indicator positioned on the edge of the circuit board for indicating that the locking member has engaged the locking point.

5. The locking circuit board extractor of claim 1 which further comprises means for visualizing at least one indicator positioned on the edge of the circuit board for indicating that the locking member has released the locking point.

6. A locking circuit board extractor for releaseably mounting a circuit board in a chassis comprising:
    a) a body portion having a lever arm, a means for engaging a pivot, and a means for engaging the chassis; and
    b) a locking member slideably mounted on the lever arm, the locking member having an engagement arm for releaseably engaging a locking point mounted on the circuit board.

7. The locking circuit board extractor of claim 6 which further comprises at least one indicator positioned on the lever arm for indicating that the locking member has engaged the locking point.

8. The locking circuit board extractor of claim 6 which further comprises at least one indicator positioned on the lever arm for indicating that the locking member has released the locking point.

9. A locking circuit board extractor for releaseably mounting a circuit board in a chassis comprising:
    a) a body portion having a lever arm, a means for engaging a pivot, and a means for engaging the chassis; and
    b) a locking member mounted on the lever arm, the locking member having an engagement arm for releaseably engaging a locking point mounted on the circuit board wherein the means for engaging the pivot comprises an elongated aperture constructed and arranged to allow the extractor to be slideably moved in a first direction to cause the engagement arm to engage the locking point, and in a second direction to cause the engagement arm to release the locking point.

10. The locking circuit board extractor of claim 9 which further comprises means for visualizing at least one indicator positioned on an edge of the circuit board for indicating that the locking member has engaged the locking point.

11. The locking circuit board extractor of claim 9 which further comprises means for visualizing at least one indicator positioned on an edge of the circuit board for indicating that the locking member has released the locking point.

12. A circuit board assembly having means for inserting and removing the circuit board from a chassis which comprises a circuit board having mounted thereon a locking circuit board extractor, a pivot, and a locking point, the extractor comprising:
  a) a body portion adapted to be mounted on an edge of the circuit board, the body portion having a lever arm, a means for engaging a pivot, and a means for engaging the chassis; and
  b) a locking member having an engagement arm, wherein said arm is adapted to allow a locking point mounted on the circuit board to be releasably engaged by sliding the arm in a direction substantially parallel to the edge of the circuit board.

13. A circuit board assembly as in claim 12 wherein the pivot comprises a pin mounted in an aperture provided on the circuit board.

14. A circuit board assembly as in claim 13 wherein the pivot pin extends through the aperture on both sides of the circuit board.

15. A circuit board assembly as in claim 12 wherein the locking point comprises a locking pin mounted in an aperture provided on the circuit board.

16. A circuit board assembly as in claim 15 wherein the locking pin extends through the aperture on both sides of the circuit board.

17. The circuit board assembly of claim 12 which further comprises at least one indicator positioned on the lever arm for indicating that the locking member has engaged the locking point.

18. The circuit board assembly of claim 12 which further comprises at least one indicator positioned on the lever arm for indicating that the locking member has released the locking point.

19. The circuit board assembly of claim 12 which further comprises means for visualizing at least one indicator positioned on the edge of the circuit board for indicating that the locking member has engaged the locking point.

20. The circuit board assembly of claim 12 which further comprises means for visualizing at least one indicator positioned on the edge of the circuit board for indicating that the locking member has released the locking point.

21. A method for releasably locking a circuit board in a chassis which comprises the steps of:
  a) providing a circuit board in a chassis, the circuit board having mounted thereon a circuit board extractor, a pivot, and a locking point, the extractor comprising:
    i) a body portion adapted to be mounted on an edge of the circuit board, the body portion having a lever arm, a means for engaging a pivot, and a means for engaging the chassis; and
    ii) a locking member having an engagement arm, wherein said arm is adapted to allow a locking point mounted on the circuit board to be releasably engaged by sliding the arm in a direction substantially parallel to the edge of the circuit board;
  b) pivoting the body portion until the lever arm is substantially parallel with the edge of the circuit board; and
  c) sliding the looking member to cause the engagement arm to engage the locking point.

* * * * *